United States Patent [19]
Brisse et al.

[11] Patent Number: 6,158,025
[45] Date of Patent: *Dec. 5, 2000

[54] APPARATUS AND METHOD FOR MEMORY ERROR DETECTION

[75] Inventors: Matthew Brisse, Madison; Richard Horney, Huntsville, both of Ala.

[73] Assignee: Intergraph Corporation, Huntsville, Ala.

[*] Notice: This patent issued on a continued prosecution application filed under 37 CFR 1.53(d), and is subject to the twenty year patent term provisions of 35 U.S.C. 154(a)(2).

[21] Appl. No.: 09/123,339

[22] Filed: Jul. 28, 1998

Related U.S. Application Data

[60] Provisional application No. 60/053,892, Jul. 28, 1997.

[51] Int. Cl.⁷ .................................................. G06F 11/08
[52] U.S. Cl. ................................ 714/48; 714/42; 714/57
[58] Field of Search .................................. 714/42, 48, 53, 714/54, 57; 712/38; 711/115

[56] References Cited

U.S. PATENT DOCUMENTS

| | | | |
|---|---|---|---|
| 4,255,808 | 3/1981 | Schaber | 371/38 |
| 4,852,100 | 7/1989 | Christensen et al. | 371/38 |
| 5,274,646 | 12/1993 | Brey et al. | 371/40.1 |
| 5,410,545 | 4/1995 | Porter et al. | 371/21.6 |
| 5,502,814 | 3/1996 | Yuuki et al. | 395/183.08 |
| 5,774,647 | 6/1998 | Raynham et al. | 395/185.01 |

FOREIGN PATENT DOCUMENTS

| | | |
|---|---|---|
| 0 494 547 A2 | 7/1992 | European Pat. Off. . |
| 0 517 403 | 12/1992 | European Pat. Off. . |
| 2313217 | 7/1997 | United Kingdom . |

*Primary Examiner*—Robert W. Beausoliel, Jr.
*Assistant Examiner*—Scott Baderman
*Attorney, Agent, or Firm*—Bromberg & Sunstein LLP

[57] ABSTRACT

A system for detecting and reporting memory errors in error correctable memory in a computer system includes a chipset that utilizes the error correctable memory for creating an error detection signal when a memory error occurs. The error detection signal includes data that may be utilized to identify the error correctable memory having a memory error. The system further includes a motherboard having two or more memory interface slots, where the error correctable memory is coupled with at least one of the interface slots, and each of the at least one slots has a unique slot identification number. The chipset is coupled to the motherboard, and the system further includes a driver coupled to the chipset. The motherboard has at least one register that receives the error detection signal and stores the data in the error detection signal in the at least one register. Furthermore, the driver reads the at least one register to determine which memory interface slot number is coupled with the error correctable memory having the error. The driver then determines the slot number based upon the contents of the at least one register.

25 Claims, 3 Drawing Sheets

APPARATUS AND METHOD FOR MEMORY ERROR DETECTION

PRIORITY

This application claims priority from U.S. Provisional Application No. 60/053,892, filed Jul. 28, 1997, the full disclosure of which is hereby incorporated herein, in its entirety, by reference.

FIELD OF THE INVENTION

This invention relates to computer systems and, more specifically, this invention relates to the detection and location of memory errors in memory of a computer system.

BACKGROUND OF THE INVENTION

In recent years, the cost of memory has been substantially reduced, and computers commonly have several hundred megabytes (MBs) of random access memory ("RAM"). With the increase in available RAM, it has become necessary to develop methods for testing the RAM to ensure its proper functioning. Consequently, some RAM has been developed that allow error correction. Error correcting memory ("ECC memory"), for example, is one type RAM that allows correction of single-bit memory errors. Undesirably, however, ECC memory does not provide a way to indicate to a user of a computer system which memory interface slot (i.e., which memory chip) has an error.

SUMMARY OF THE INVENTION

In accordance with one aspect of the invention, a system for detecting and reporting memory errors in error correctable memory in a computer system includes a chipset that utilizes the error correctable memory for creating an error detection signal when a memory error occurs. The error detection signal includes data that may be utilized to identify the error correctable memory having a memory error. The system further includes a motherboard having two or more memory interface slots, where the error correctable memory is coupled with at least one of the interface slots, and each of the at least one slots has a unique slot identification number. The chipset is coupled to the motherboard, and the system further includes a driver coupled to the chipset. The chipset has at least one register that receives the error detection signal and stores the data in the error detection signal in the at least one register. Furthermore, the driver reads the at least one register to determine which memory interface slot number is coupled with the error correctable memory having the error. The driver then determines the slot number based upon the contents of the at least one register.

In preferred embodiments, the driver stores the slot number of the interface slot that is coupled with the error correctable memory having the error in a storage device. Such storage device may include the system registry. In other embodiments, the driver transmits a message to a display device for displaying indicia relating to the slot number of the interface slot that is coupled with the error correctable memory having the error. The display device may utilize a graphical user interface for displaying the slot number.

The registers include other information relating to the memory having the error. For example, the registers may include data relating to interleaving by the error correctable memory, or data indicating whether the error correctable memory is enabled to correct memory errors. The registers also may include a chunk number and a partial address of the memory having the error.

BRIEF DESCRIPTION OF THE DRAWINGS

The foregoing and other objects and advantages of the invention will be appreciated more fully from the following further description thereof with reference to the accompanying drawings wherein.

DESCRIPTION OF PREFERRED EMBODIMENTS

Figure 1:
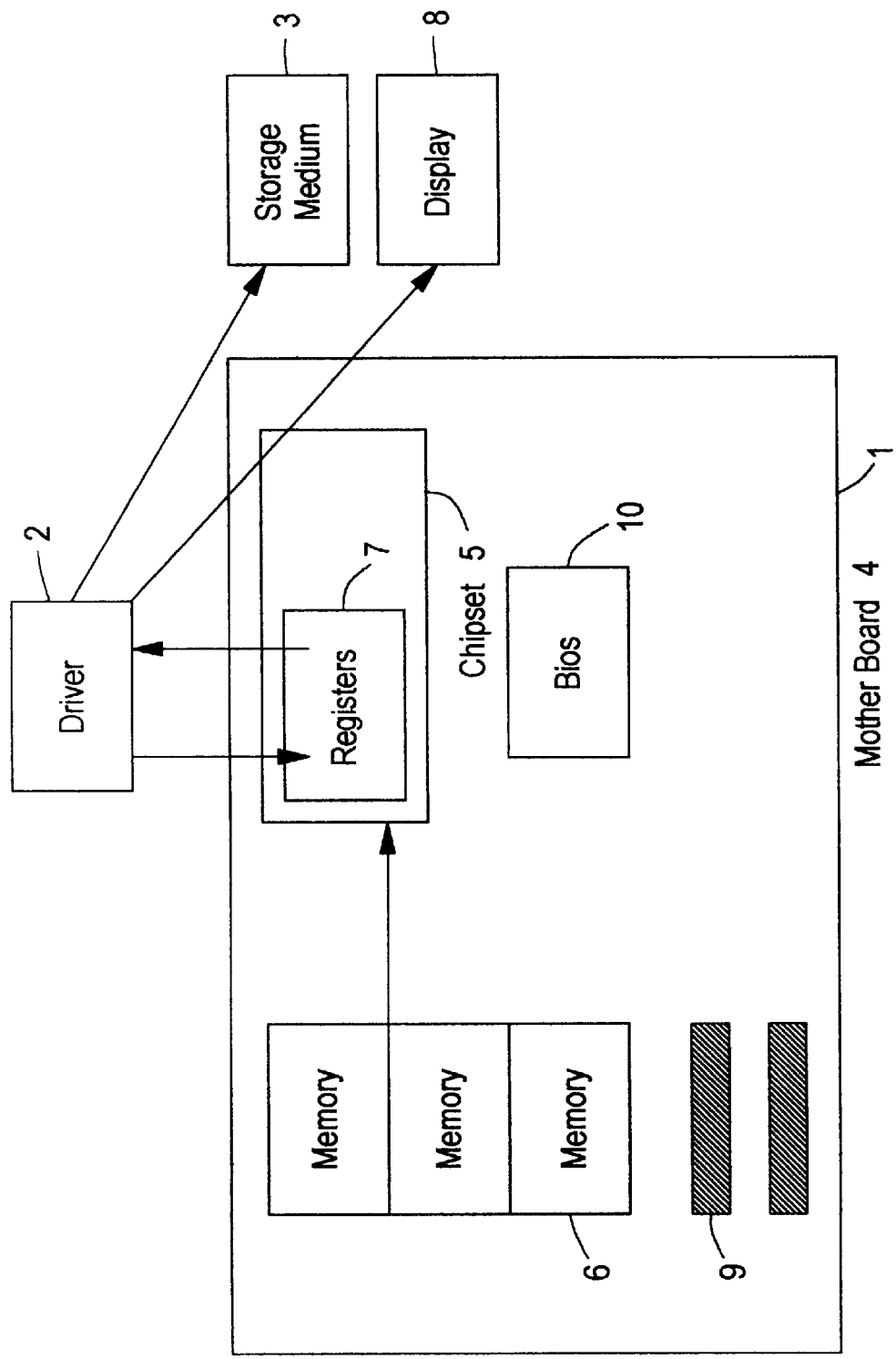
FIG. 1 schematically shows a preferred computer system that includes a driver for determining the location of a memory error.

For the purposes of this specification, it is understood that the operating system in which the preferred embodiment operates will be the Microsoft Windows NT™ operating system, available from Microsoft Corp. of Redmond, Wash. It is further understood that the invention applies to any computer hardware manufacturer's machines, and may be operated under a different operating system environment. In this specification and the following claims, the term "storage medium" shall refer to any location that data may be stored within a computer system such as a disk array, or other non-volatile memory. Herein, the term "error correctable memory" shall refer to any type of volatile memory such as, for example, parity memory, which is capable of being corrected either automatically or by an outside source such as a computer program. Other exemplary memory types utilizing error correctable memory include a single inline memory modules (SIMM), or dual inline memory modules (DIMM). Preferred embodiments of the invention may be used with any error correctable memory known in the art.

Computer systems such as, for example, an IBM THINKPAD 701® computer (distributed by International Business Machines of Armonk, N.Y.) typically are built with a motherboard that implements much of the system functionality. As is known in the art, the motherboard typically includes a chipset (discussed below), a central processing unit ("CPU"), a basic input/output system ("BIOS"), memory interface slots for interfacing with memory devices (e.g., memory chips or memory cards), mass storage interfaces, serial and parallel ports, expansion slots, and a number of controllers required to control standard peripheral devices. In accord with a preferred embodiment of the invention, an error location device (referred to herein as a "driver") detects when a bit error has occurred in an error correctable memory chip, and then locates the memory interface slot that couples such chip to the motherboard.

In a preferred embodiment, the error correctable memory is error correcting code memory ("ECC memory"). Typically, the chipset is enabled to perform its error correcting function by a BIOS program setting a bit in a register of a computer. The BIOS program is built-in software in a read only memory (ROM) chip on the motherboard that determines what a computer can do without accessing programs from nonvolatile memory. The BIOS typically controls the memory and configures the chipset. As is known in the art, the chipset is a integrated set of chips that perform many vital functions of a computer system. Among other things, such functions include data transfer, and input and output operations.

Error correctable memory typically utilizes first and second memory spaces. The first memory space is for storing data, while the second memory space is for storing error detection data. The chipset uses an algorithm to encode information in the error detection data which contains sufficient detail to permit the recovery of a single-bit error. The chipset checks the ECC memory each time it is accessed by the computer's central processing unit (CPU). As data is moved by the CPU from the ECC memory chip to the cache line (a/k/a cache), an algorithm is executed that checks for errors in the ECC memory chip. If a single-bit error has occurred, the chipset first corrects the error and then transfer information relating to the error to a plurality of registers within the chipset. Details of this process are discussed below with reference to FIG. 2.

FIG. 1 schematically shows a preferred system for determining both if a bit error has occurred in error correctable memory, and the location of a memory interface slot containing the error correctable memory chip with the bit error. In the preferred embodiment, the system 1 includes error correctable memory 6 (e.g., three ECC memory chips), a chipset 5 with accompanying registers 7 (discussed below), a BIOS 10 for controlling system functions, and a driver program (hereinafter "driver 2") configured to execute every preselected time interval (e.g., every time the system 1 is initialized by the BIOS 10 and chipset 5). The system further includes a nonvolatile storage medium 3 (e.g., a hard disk) for long term data storage, and a display device 8 for displaying data to a user.

As discussed in detail below, the driver 2 periodically polls the registers 7 on the chipset 5 to determine whether an error exists on the memory chips 6. In a preferred embodiment of the invention, the registers 7 include four thirty-two bit registers. Those four registers 7 include a error command register for determining if error correctable memory is enabled, a command register for storing interleaving information, a single bit error register for providing a partial address of the slot (if any) containing a memory error, and a memory error status register for determining if an error has been found within memory. The interleaving information stored in the command register indicates whether the error correctable memory is interleaved, the type of interleaving, and which memory interface slots are enabled (i.e., which slots include a memory chip or memory card). Although the single bit error register provides a partial address, it should be understood that the full address relates to a specific memory location on one of the error correctable memory chips.

Figure 2:
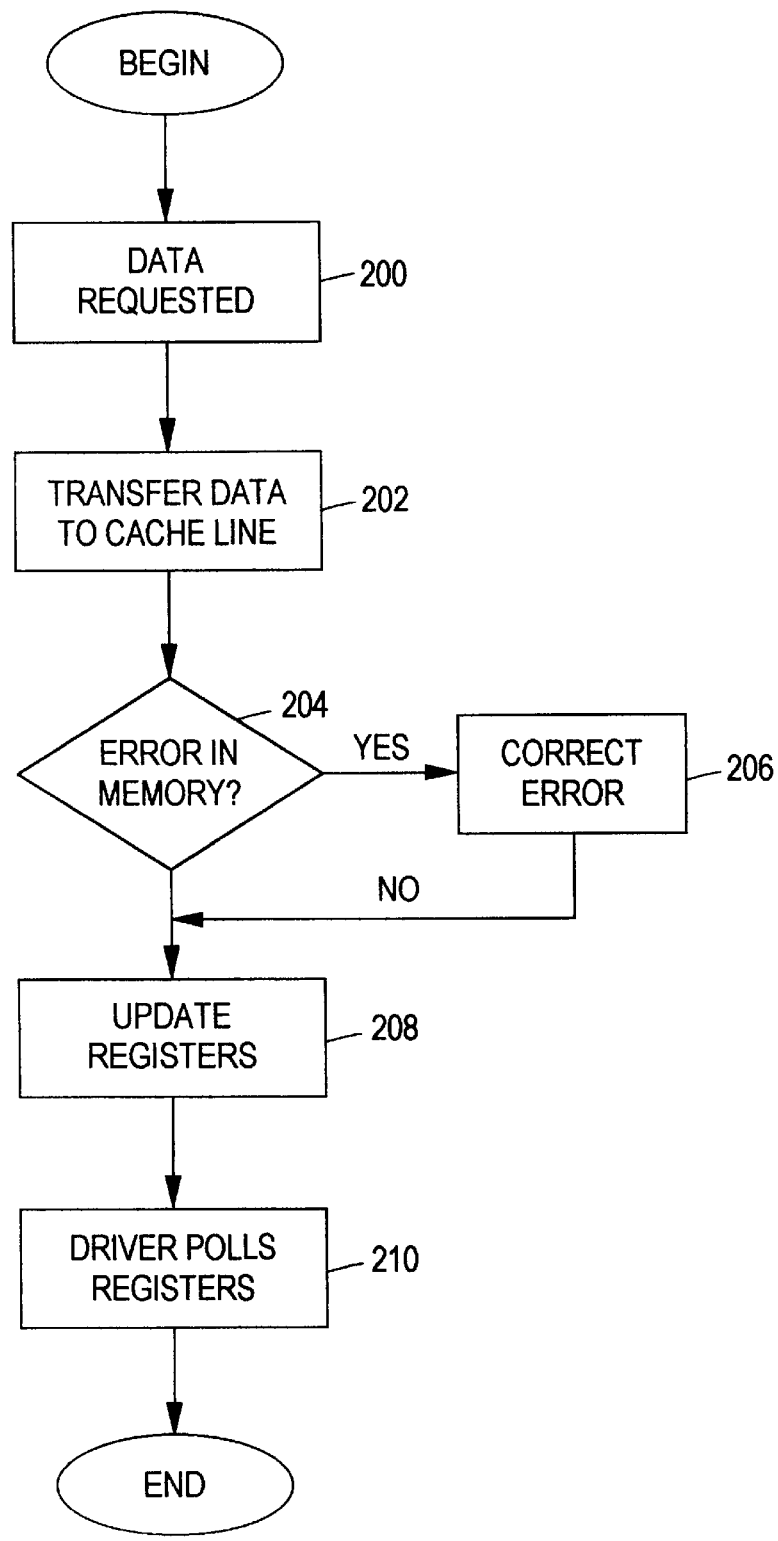
FIG. 2 shows a preferred method of locating errors in memory chips and determining the memory slot having a memory chip with the error.

FIG. 2 shows a preferred method of locating errors in the memory chips 6 and determining the memory slot having the memory chip 6 with the error. The method begins at step 200 in which data is requested from one of the memory chips 6. For example, the CPU may request data for processing in system cache line (not shown). The process continues to step 202 in which data is transferred to the cache line. It then is determined (at step 204) by the chipset if the memory chip 6 that transferred the data had an associated error. If an error is detected, then the error is corrected by the chipset (step 206) and the appropriate registers in the chipset are updated accordingly (step 208). If an error is not detected at step 204, however, then the process continues to step 208 in which the appropriate registers 7 in the chipset 5 are updated (if necessary). The process then continues to step 210 in which the driver 2 polls the registers 7 and determines if the memory chips 6 include an error. If at least one of the memory chips 6 has an error, then the driver 2 determines which memory chip 6 has the error, and then either stores the data in a registry (e.g., the Windows NT™ registry), or displays a graphical user interface ("GUI") on the display device 8 indicating which memory chip 6 has the error.

Figure 3:
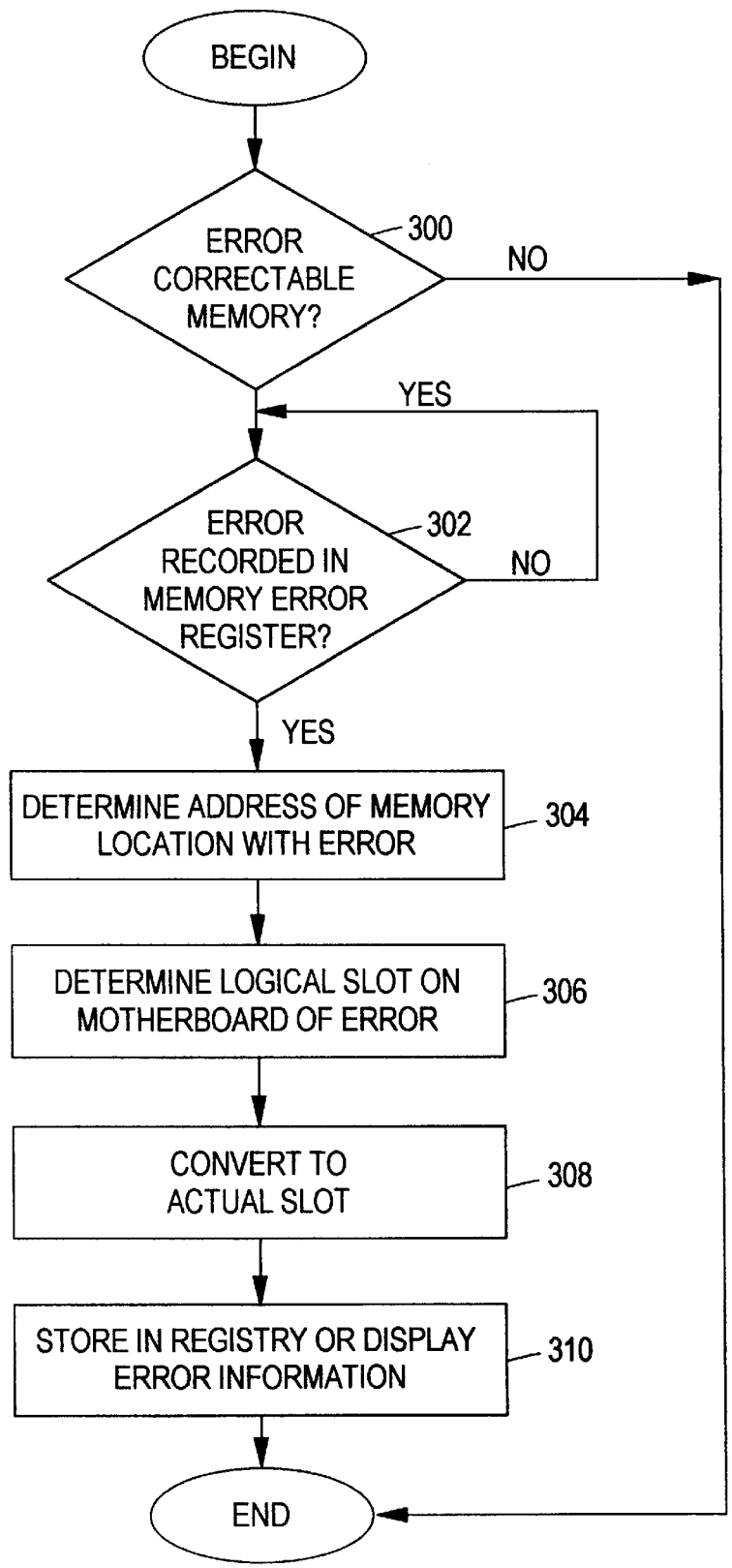
FIG. 3 shows a preferred process used by a driver shown in FIG. 1 for determining if memory chips in the computer system include an error.

FIG. 3 shows a preferred process used by the driver 2 for implementing the function shown in step 210 of FIG. 2. The process begins at step 300 in which the driver 2 polls the error command register 7 to determine if the chipset is enabled to correct memory errors. This polling may be preconfigured to occur at selected time intervals. The process ends if the error correcting bit of the error command register 7 is not enabled on the chipset. If the error correcting bit is enabled at step 300, however, then the process continues to step 302 in which it is determined if an error is recorded in the memory error status register. As noted above, if an error is detected at step 204 of FIG. 2, then data is entered into the memory error status register 7 to reflect that an error has occurred. Accordingly, if an error was detected at step 204, then the driver 2 can detect such error merely by polling the memory error status register 7. If the memory error register indicates that no error has occurred, then the process pauses for a predetermined amount of time.

If it is determined at step 302 that an error has occurred, then the process continues to step 304 in which the address of the memory location having an error is determined. The address is an address location on one of the memory chips 7 on the motherboard 4. To that end, the driver 2 accesses the single bit error register to determine such address. The single bit register includes a thirty-two bit address having bits numbered from zero to thirty-one. In preferred embodiments, bit zero is not used. Bits one and two provide a chunk number that determines the location within the cache line of the memory error. Chunks are well known in the art. Bits three through thirty-one provide a partial address of the location of the error within the error correctable memory. The driver 2 determines the complete address by accessing a first conversion table (e.g., a first lookup table) in which the chunk number and bits 3 and 4 of the partial address are utilized to determine the complete address of the memory location having the error.

After the complete address is determined, the process continues to step 306 in which the logical interface slot number (on the motherboard) identifying the slot 9 having the error is determined. The logical slot number is determined by first determining how many of the interface slots on the motherboard are in use. Each of the slots in use thus may be assigned ascending slot numbers beginning with slot number zero. For example, if three slots are in use on a motherboard having ten interface slots, then such three logical slots are assigned ascending slot numbers starting from slot zero (i e., slots number zero, one and two, respectively). In a similar manner, if four slots are in use on such motherboard, then such slots are assigned logical slot numbers zero, one, two, and three, respectively.

The interface slot number identifying the slot having the memory chip 6 with the error may be determined by accessing the command register to determine whether the error correctable memory is interleaved, and to identify the memory interface slots that are in use. Based upon the number, the type of interleaving, and the complete memory address determined from the conversion table, the logical slot may be determined from a second conversion table (i.e., a second look-up table).

After the logical slot number of the interface slot with the error is determined, then the process continues to step 308 in which the logical slot number is converted to an actual slot number, thus affirmatively identifying the actual slot that has the memory chip 6 with the error. This may be determined in any convenient manner by accessing the information in the command register to determine which exact slots are in use. Once the actual slot number of the interface slot with the error is determined, then the process continues to step 310 in which the actual slot number is stored in the Windows NT™ system registry. In alternative embodiments, as discussed below, the actual slot number may be displayed on a graphical user interface on the display device 8, thus ending the process. In some embodiments, after executing step 310, the driver 2 may pause for a predetermined amount of time before again reading the single bit error register to determine if another error has occurred in the error correctable memory.

As is known in the art, the system registry is a system database maintained by the operating system to store data such as, for example, system configuration information, installation information, and information relating to installed hardware and software devices. In preferred embodiments, the driver 2 increments an error count in the system registry. Upon detection of an error, the driver 2 preferably reports such error and count to the well known Windows NT™ System Event log, and/or to the graphical user interface (step 310). As is known in the art, the Event Log is a file for storing various error conditions and status messages that may be transmitted by software components installed into the Windows NT™ operating system environment.

In a preferred embodiment, the graphical user interface (GUI) reports the total number of errors that have been detected, and pinpoints their location by reporting whether an error has been detected in each memory interface slot 9 to the display 8. The GUI preferably includes a clear button so that a user may reset the total error count to zero after a faulty SIMM is replaced. In addition, a preferred embodiment of the invention detects the removal and insertion of replacement memory and automatically resets the error counters. One single-bit error may be used to determine that one of the memory chips 6 is defective or damaged.

It is known in the art that single-bit memory errors can be caused by transient conditions such as, for example, random particle bombardment, or changing voltage levels in the computing hardware. The occurrence of such errors, however, generally does not indicate that a memory chip 6 has an error. Accordingly, when used with a system having a large amount of RAM memory, an alternative embodiment of the invention filters out occasional single-bit errors without displaying information (via the GUI) concerning the error. In this embodiment, the driver 2 tracks the total number of single bit errors, and stores this value in a storage medium, such as the Windows NT™ registry. The total number of errors per memory chip 6 also may be tracked. However, no Event Log message is generated and no errors are reported via the GUI unless more than a preselected number of single-bit errors is detected within a fixed period of time. For example, a log message may be generated if two errors are detected in a twenty-eight day period. Accordingly, when a second (i.e., subsequent) error is detected during this twenty-eight day time period, all errors stored in the storage medium that have occurred within the period and that have not been logged to the Event Log are then be logged with their original time stamps. In the GUI, the total number of errors that have occurred during the previous period will be reported. The absolute total also may be kept in the storage medium or registry, but otherwise is not be made available to the user. The GUI then reports the condition of each memory interface slot 9. In this embodiment, the clear button within the GUI may be used when an error correctable memory chip 6 is replaced to clear the absolute total, the time period total, and errors noted for memory chip 6.

In another embodiment of the invention, memory errors may be detected during manufacture. In this embodiment, the time period functionality is disabled and all errors are reported to the Event Log and within the GUI regardless of the time frame in which they occur. This embodiment may be utilized in manufacturing test images and systems undergoing hot room testing. A specialized utility program may be utilized to switch the invention to and from use of time periods.

In a further embodiment, a networked computer is equipped with a program known as Monitor Module ("MM program"), available from Intel Corporation of Santa Clara, Calif. The MM program monitors the System Event Log for the memory error and then transmits an alert to a system administrator via a simple network management protocol (SNMP), modem, or a pager. The MM program preferably is configured to recognize the error messages produced by the driver 2 that are placed in the System Event Log.

In an alternative embodiment, the invention may be implemented as a computer program product for use with a computer system. Such implementation may include a series of computer instructions fixed either on a tangible medium, such as a computer readable media (e.g., a diskette, CD-ROM, ROM, or fixed disk), or transmittable to a computer system via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable media with accompanying printed or electronic documentation (e.g., shrink wrapped software), preloaded with a computer system (e.g., on system ROM or fixed disk), or distributed from a server or electronic bulletin board over the network (e.g., the Internet or World Wide Web).

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

We claim:

1. A system for detecting and reporting bit errors in error correcting code memory in a computer system, the system comprising:

error correcting code memory;

a motherboard having two or more memory interface slots, the error correcting code memory situated in at least one slot, each memory interface slot having a memory interface slot number;

a chipset coupled to the motherboard, the error correcting code memory, in conjunction with the chipset for creating an error detection signal when a bit error is corrected by the chipset, the chipset having at least one register which receives the error detection signal and stores the error detection signal in the at least one register creating a register signal; and a driver coupled to the chipset for reading the register signal in the at least one register, calculating and reporting the memory interface slot number of the error correcting code memory based at least on the register signal.

2. A system according to claim 1, wherein the register signal indicates that a bit error has occurred and the register signal indicates at least part of the address of the error correcting code memory generating the bit error.

3. A system according to claim 1, wherein the memory interface slot number is reported to the registry of an operating system.

4. A system according to claim 3, wherein the operating system is Windows NT.

5. A system according to claim 1, wherein the memory interface slot number is reported to a display.

6. A method of indicating a memory interface number of an error correcting code memory chip having an error, the method comprising:

reading a register containing memory error information of the error correcting code memory chip after the error in the error correcting code memory is corrected;

calculating the memory interface number of the error correcting code memory chip based on the memory error information from the register; and reporting the error and the memory interface number of the error correcting code memory chip having the error.

7. A method according to claim 6 further comprising:

transferring the memory interface number to a storage medium.

8. A method according to claim 7, wherein the storage medium is associated with the registry of an operating system.

9. A method according to claim 8 wherein the operating system is Windows NT.

10. A method according to claim 6 further comprising:

causing an alarm to alert a user that the error correcting code memory chip requires replacement.

11. A method of determining the memory interface slot number of an error correcting code chip in a computer in which the error correcting code memory chip has experienced an error and the error has been corrected, the method comprising:

reading at least one register of a chipset containing information indicating that error correcting code memory has had an error and the error has been corrected;

calculating the memory interface slot number of the error correcting code memory having the error based on the information from the register; and reporting the memory interface slot number.

12. A method according to claim 11 further comprising storing the memory interface slot number in a storage medium.

13. A method according to claim 11 further comprising:

displaying the memory interface slot number on a display of the computer.

14. A computer program product for use on a computer system for determining the memory interface slot number of an error correcting code memory module in a set of error correcting code memory modules in a computer system in which one error correcting code memory module has experienced an error and the error has been corrected, the computer program product comprising a computer usable medium having computer readable program code thereon, the computer readable program code comprising:

program code for reading a register of a chipset containing information indicating that one of the error correcting code memory modules has had an error and the error has been corrected;

program code for determining the memory interface slot number of the error correcting code memory having an error based on the information from the register; and program code for reporting the memory interface slot number.

15. The computer program product as defined by claim 14 further comprising:

program code for displaying the reported memory interface slot number on a display device.

16. The computer program product as defined by claim 14 further comprising:

program code for storing the reported memory interface slot number in a storage device.

17. The computer program product as defined by claim 16 wherein the storage device includes a system registry.

18. A system for detecting and reporting memory errors in error correcting code memory in a computer system, the computer system comprising:

a motherboard having two or more memory interface slots, the error correcting code memory being coupled with at least one of the interface slots, each of the at least one slots having a unique slot identification number;

a chipset coupled to the motherboard, the error correcting code memory creating an error detection signal, in conjunction with the chipset, when a memory error is corrected by the chipset, the error detection signal including data that may be utilized to identify the error correcting code memory having the memory error, the chipset having at least one register that receives the error detection signal and stores the data in the error detection signal in the at least one register; and a driver coupled to the chipset for reading the at least one register, the driver determining the memory interface slot number coupled with the error correcting code memory having the error, the driver determining the slot number based upon the contents of the at least one register.

19. The system as defined by claim 18 wherein the driver stores the slot number of the interface slot coupled with the error correcting code memory having the error in a storage device.

20. The system as defined by claim 19 wherein the storage device includes a system registry.

21. The system as defined by claim 18 wherein the driver transmits a message to a display device for displaying indicia relating to the slot number of the interface slot that is coupled with the error correcting code memory having the error.

22. The system as defined by claim 21 wherein the display device utilizes a graphical user interface for displaying the slot number.

23. The system as defined by claim 18 wherein the registers include data relating to data interleaving by the error correcting code memory.

24. The system as defined by claim 18 wherein the registers include data relating to whether the error correcting code memory is enabled.

25. The system as defined by claim 18 wherein the registers include a chunk number and a partial address.

* * * * *